United States Patent
Yang

(10) Patent No.: US 9,899,069 B1
(45) Date of Patent: Feb. 20, 2018

(54) ADAPTABLE SENSE CIRCUITRY AND METHOD FOR READ-ONLY MEMORY

(71) Applicant: FREESCALE SEMICONDUCTOR, INC., Austin, TX (US)

(72) Inventor: Jianan Yang, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/223,213

(22) Filed: Jul. 29, 2016

(51) Int. Cl.
  G11C 7/02 (2006.01)
  G11C 7/22 (2006.01)
  G11C 7/06 (2006.01)
  G11C 7/14 (2006.01)
  G11C 7/12 (2006.01)
  G11C 7/10 (2006.01)

(52) U.S. Cl.
  CPC .............. G11C 7/222 (2013.01); G11C 7/065 (2013.01); G11C 7/10 (2013.01); G11C 7/12 (2013.01); G11C 7/14 (2013.01)

(58) Field of Classification Search
  CPC ........... G11C 7/222; G11C 7/065; G11C 7/10; G11C 7/12; G11C 7/14
  USPC ........................................................ 365/207
  See application file for complete search history.

(56) References Cited

U.S. PATENT DOCUMENTS

| 4,270,190 A * | 5/1981 | Jindra ..................... G11C 17/12 327/51 |
| 6,034,908 A * | 3/2000 | Becker ................. G11C 7/1051 365/189.05 |
| 2007/0217246 A1* | 9/2007 | Kurata ..................... G11C 7/12 365/94 |
| 2009/0015294 A1 | 1/2009 | Cheng |
| 2011/0211382 A1 | 9/2011 | Sharma et al. |
| 2013/0010544 A1 | 1/2013 | Lin et al. |

FOREIGN PATENT DOCUMENTS

JP        2011086357 A      4/2011

* cited by examiner

*Primary Examiner* — Tha-O H Bui

(57) ABSTRACT

Apparatus and methods for operating a read-only memory (ROM) are disclosed. The method for operating the ROM includes sensing a dummy bit line with a dummy sense amplifier coupled to the dummy bit line to generate a keeper adjust signal. Based on the keeper adjust signal, a keeper strength of a keeper circuit coupled to a sense amplifier circuit is adjusted. The sense amplifier circuit is capable of sensing data stored in the ROM.

19 Claims, 4 Drawing Sheets

ADAPTABLE SENSE CIRCUITRY AND METHOD FOR READ-ONLY MEMORY

BACKGROUND

Field

This disclosure relates generally to read-only memory (ROM), and more specifically, to a system and method for sensing data in a ROM.

Related Art

Read-only memories (ROM) are widely used in various computational and data processing systems. With the advancements in semiconductor fabrication processes, higher density and higher performing ROMs are possible. ROMs are generally configured in many sizes and aspect ratios based on the applications associated with the computational and data processing systems. However, significant challenges exist in trying to maintain consistent performance between large ROM arrays and small ROM arrays over a myriad of environmental conditions and system requirements.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an apparatus and method for sensing and operating a read-only memory (ROM). Because ROM array sizes and operating conditions may vary widely over a broad range of applications, an adaptable keeper circuit scheme is coupled with a single-ended sense amplifier to deliver optimum performance. Dummy sensing schemes are provided which allow for generation of control signals to adjust sense amplifier keeper circuits. The dummy sensing schemes can correspond to best case and worse case bit line leakage scenarios, for example. By utilizing the control signals generated from the dummy sensing schemes, keeper transistors can be activated to increase keeper strength in sense amplifiers circuits to sense data stored in the ROM.

Figure 1:
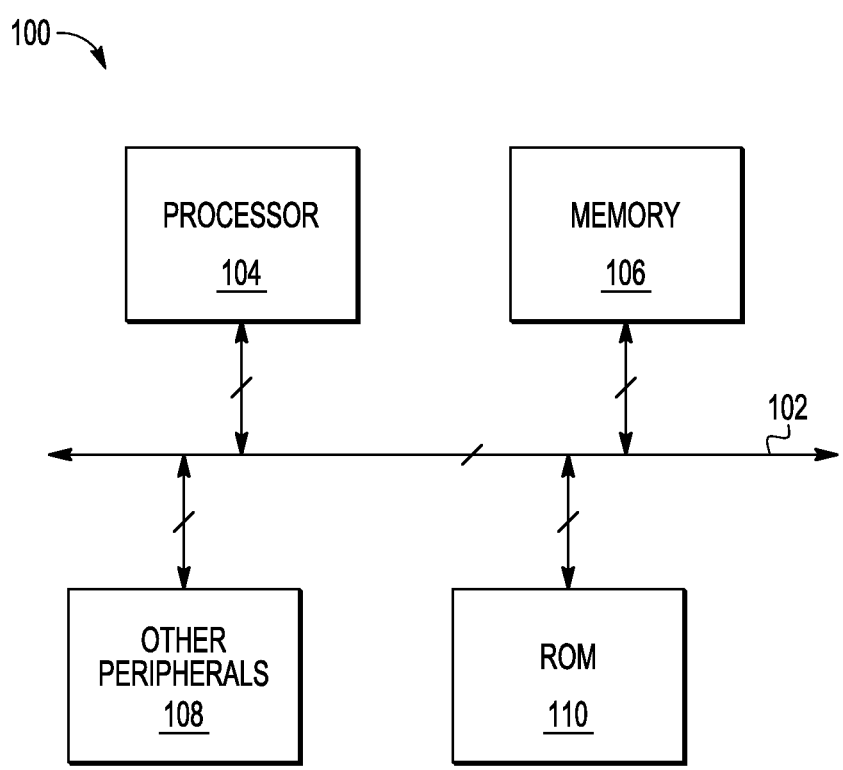
FIG. 1 illustrates, in block diagram form, an exemplary data processing system according to an embodiment of the present disclosure.

FIG. 1 illustrates, in block diagram form, an exemplary data processing system 100 according to an embodiment of the present disclosure. In some embodiments, data processing system 100 may be characterized as a system-on-a-chip (SoC). System 100 includes system bus 102, processor 104, memory 106, other peripherals 108, and ROM 110. Processor 104, memory 106, other peripherals 108, and ROM 110 are each bidirectionally coupled to system bus 102 by way of respective communication buses.

System bus 102 can be any type of bus for communicating any type of information such as address, data, instructions, clocks, and control. System bus 102 provides a communication backbone for communications among the processor 104, memory 106, other peripherals 108, and ROM 110.

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Processor 104 is configured to execute sets of instructions in order to carry out designated tasks.

Memory 106 may include any type of volatile or non-volatile memory array cells, such as dynamic random access memory (DRAM), static random access memory (SRAM), flash, etc. Processing system 100 may include multiple memories like memory 106 or a combination of different memories. For example, processing system 100 may include a flash memory in addition to memory 106.

Other peripherals 108 of processing system 100 may include any number of other circuits and functional hardware blocks such as accelerators, timers, counters, communications, interfaces, analog-to-digital converters, digital-to-analog converters, PLLs, and the like for example. Other peripherals 108 are each bidirectionally coupled to system bus 102 by way of respective communication buses.

ROM 110 may be any type of read-only non-volatile memory such as mask programmable memory, one-time programmable memory, fuse programmable memory, and the like. ROM 110 may be configured in any size and topography suitable for processing system 100. ROM 110 may be characterized as a boot ROM. In some embodiments, ROM 110 may include look-up table data or other data that would not need to be changed for the life of processing system 100.

Figure 2:
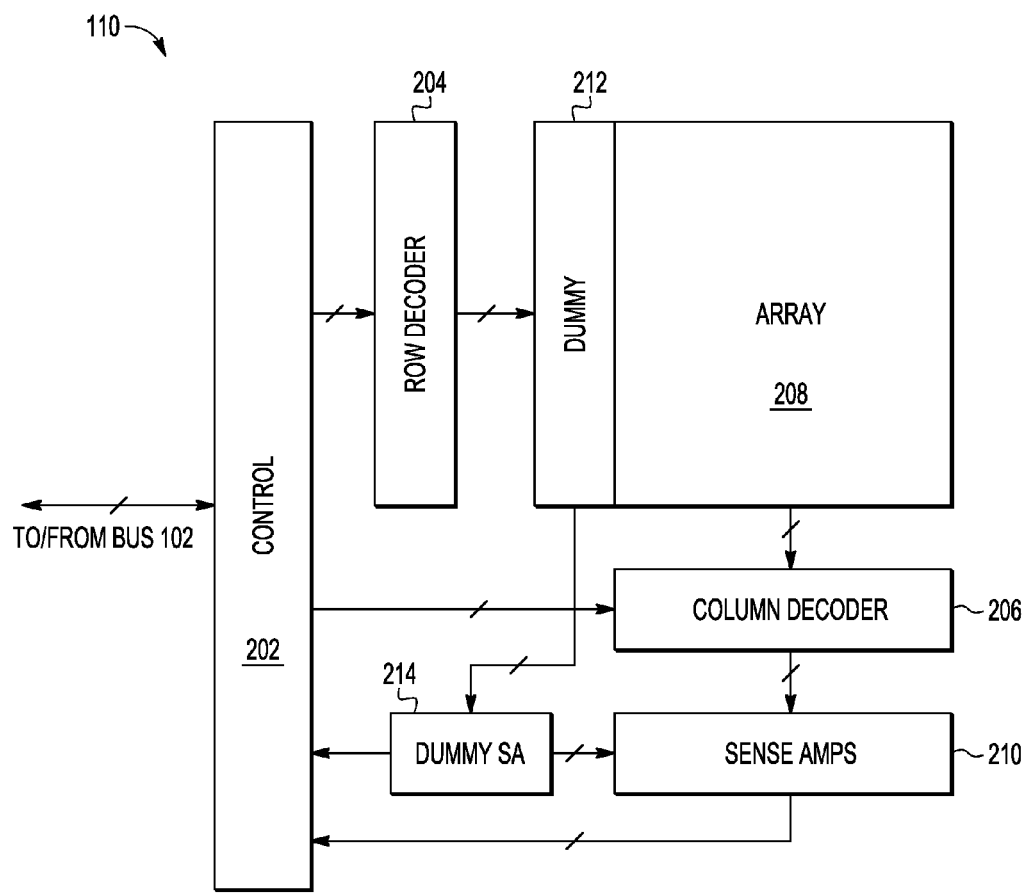
FIG. 2 illustrates, in block diagram form, a more detailed representation of the ROM in FIG. 1 according to an embodiment of the present disclosure.

FIG. 2 illustrates, in block diagram form, a more detailed representation of ROM 110 in FIG. 1 according to an embodiment of the present disclosure. ROM 110 includes control unit 202, row decoder 204, column decoder 206, memory array 208, sense amplifiers 210, dummy array 212, and dummy sense amplifiers 214. The control unit 202 of ROM 110 is coupled to system bus 102 by way of a communication bus. The communication bus generally includes address, data, clocks, and control signals for communicating with processor 104 for example. The control unit is coupled to provide address information to row decoder 204 and column decoder 206. The control unit 202 is coupled to receive and latch data from sense amplifiers 210. The control unit 202 is also coupled to receive one or more flags from dummy sense amplifiers 214. Such flags may be provided to processing system 100 by way of control unit 202.

Memory array includes a plurality of read-only non-volatile memory cells arranged in rows and columns. Row decoder 204 is coupled to memory array 208 and based on provided address information, activates a desired word line to read one or more memory cells of the memory array 208. Column decoder 206 is coupled between memory array 208 and sense amplifiers 210 and based on provided address information, selects desired columns or bit lines to read the one or more memory cells of the memory array 208. For example, memory array 208 may include 256 columns, and column decoder 206 may be configured to select a subset of 16 columns to couple to sense amplifiers 210 for reading memory cells of the memory array 208. As used herein, the terms bit line and column may be used interchangeably, and the terms word line and row may be used interchangeably.

Sense amplifiers 210 are coupled to column decoder 206 and include circuitry to sense voltage on each selected bit line such that the sensed voltage level determines the value of data stored in memory cells. In this embodiment, the circuitry of sense amplifiers 210 is arranged in single-ended sense amp configuration. Data sensed in sense amplifiers 210 is provided to control unit 202 where the data is latched.

Dummy array 212 includes one or more dummy bit lines formed similarly to the bit lines of memory array 208. In this embodiment, dummy array 212 is located adjacent to memory array 208 such that dummy array 212 and memory array 208 can be formed in one contiguous array, having a common column pitch, memory cell structure, and the like for example. The one or more dummy bit lines may be configured to represent a pre-determined capacitive load, leakage, or other topological or electrical characteristic. For example, a dummy bit line configured to represent a best case leakage scenario may include a bit line in the dummy array 212 having only one memory cell coupled to the bit line.

Dummy sense amplifiers 214 are coupled to dummy array 212 and include circuitry to sense voltage on each of the one or more dummy bit lines such that the sensed voltage level determines the value of data stored in memory cells. Dummy data sensed in dummy sense amplifiers 214 is provided to keeper circuitry in sense amplifiers 210. Because the dummy bit lines can be configured to represent best case, worst case, or boundary performance cases, whether data is correctly sensed from such dummy bit lines can be useful to self-adjust keeper circuitry in the sense amplifiers 210. Dummy sense amplifiers 214 also include circuitry to generate one or more flags which are provided to the control unit 202. The one or more flags provide an indication that one or more dummy sensed data did not produce an expected result. In some embodiments, the one or more flags provide an indication that one or more dummy sensed data produced an expected result.

Figure 3:
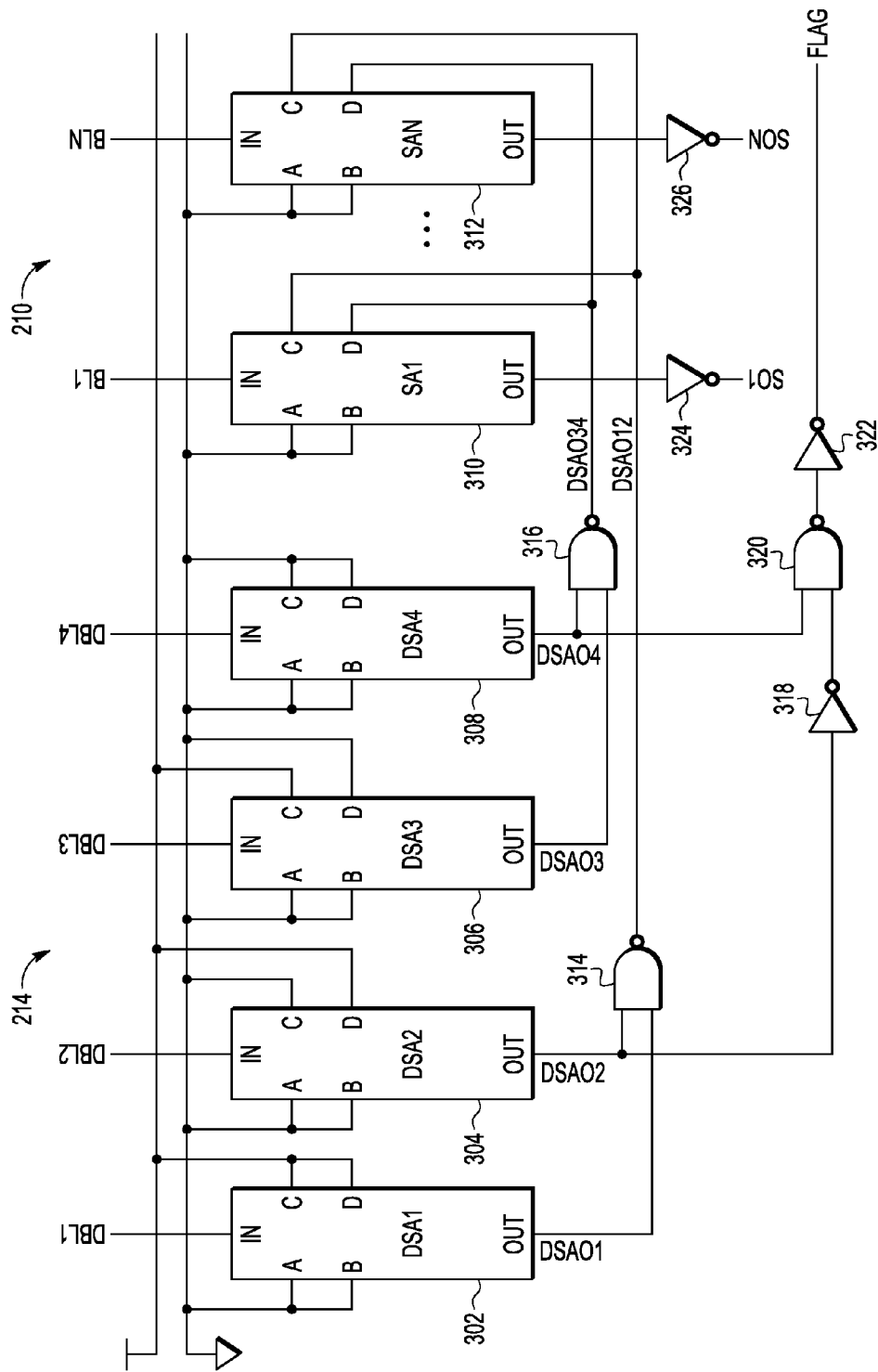
FIG. 3 illustrates, in schematic form, a more detailed representation of sense amplifier blocks depicted in FIG. 2 according to an embodiment of the present disclosure.

FIG. 3 illustrates, in schematic form, a more detailed representation of sense amplifier block 210 and dummy sense amplifier block 214 depicted in FIG. 2 according to an embodiment of the present disclosure. The schematic of FIG. 3 includes dummy sense amplifier circuits DSA1-4 (302-308), associated dummy logic circuitry formed with logic gates 314-322, sense amplifier circuits SA1-N (310, 312) and respective drivers (324, 326) having output signals SO1-N, where N is the number of sense amplifier circuits to sense data stored in memory array 208. In this embodiment, circuit blocks 302-312 are instances or copies of sense amplifier circuitry 400 of FIG. 4 described below. Because dummy sense amplifier circuit blocks and sense amplifier circuit blocks (302-312) are substantially the same, these blocks can be readily instantiated with memory compiler tools, for example.

Figure 4:
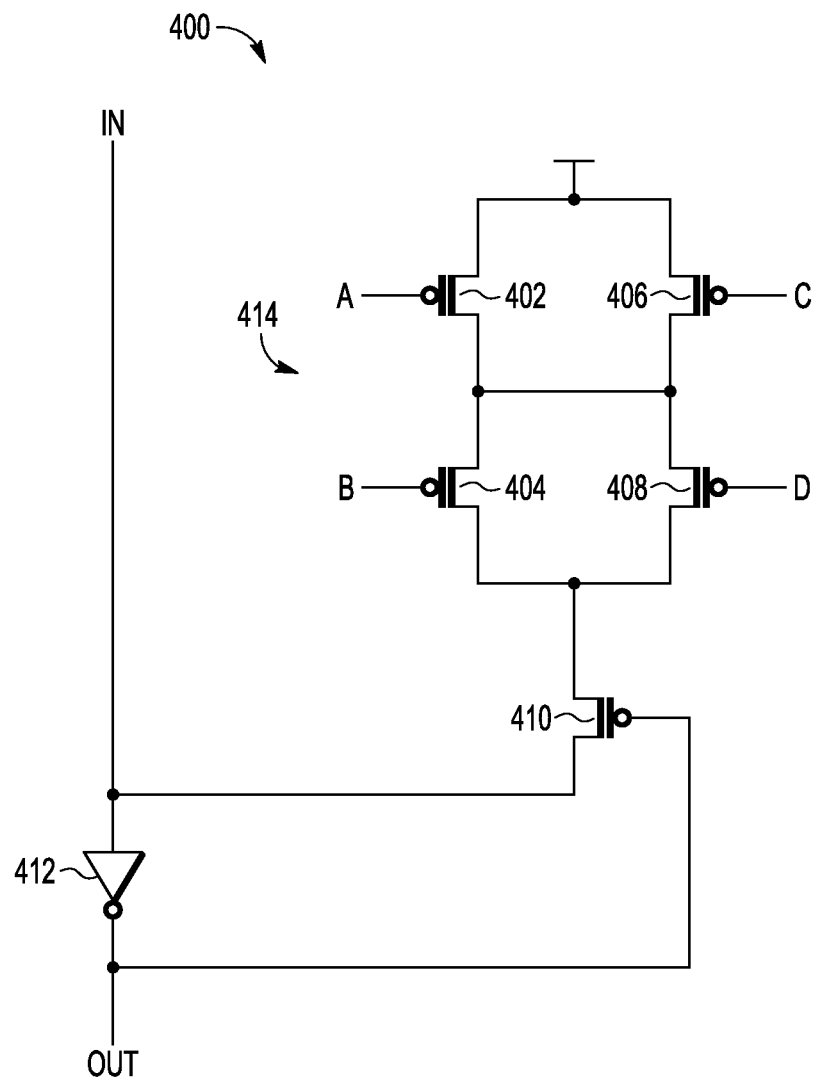
FIG. 4 illustrates, in schematic form, simplified sense amplifier circuitry in accordance with an embodiment of the present disclosure.

FIG. 4 illustrates, in schematic form, simplified sense amplifier circuitry 400 in accordance with an embodiment of the present disclosure. Sense amplifier circuitry 400 includes exemplary sense amplifier circuit 412 and keeper circuit 414 formed by P-channel transistors 402-410. Sense amplifier circuitry 400 further includes an input labeled IN coupled to an input of sense amplifier circuit 412 and to a bit line of memory array 208 or dummy array 212. Inputs labeled A-D are coupled to control electrodes of keeper transistors of keeper circuit 414 and are coupled to receive control or configuration signals. An output of sense amplifier circuitry 400 labeled OUT is coupled to the output of sense amplifier circuit 412.

Sense amplifier circuit 412 may be any suitable inverting or non-inverting single-ended sense amplifier circuit suitable for sensing data stored in a ROM array. In this embodiment, sense amplifier circuit 412 is depicted as an inverter having an input coupled to the input labeled IN and an output coupled to the output labeled OUT of sense amplifier circuitry 400.

The keeper circuit 414 is coupled to sense amplifier circuit 412 to offset logic level degradation due to leakage current of a bit line coupled at the IN input. Transistors of the keeper circuit 414 are typically characterized as weak transistors. However, the keeper circuit must be strong enough to sustain a logic high level at the sense amplifier circuit input despite bit line leakage currents, and at the same time must be weak enough to allow an accessed bit to pull down the bit line without excessive timing or current drain penalties. In this embodiment, the keeper circuit 414 includes a first transistor 410 having a first current electrode coupled to the input of sense amplifier circuit 412 labeled IN and a control electrode coupled to the output of the sense amplifier circuit 412 labeled OUT. Series coupled transistors are coupled between transistor 410 and a first voltage source such as VDD. In this embodiment, VDD is characterized as a voltage source having a nominal voltage sufficient for normal operation of ROM 110. The series coupled transistors include a second transistor 404 having a first current electrode coupled to a second current electrode of the first transistor 410 and a control electrode coupled to an input labeled B, and a third transistor 402 having a first current electrode coupled to the second current electrode of the second transistor 404, a control electrode coupled to an input labeled A and a second current electrode coupled to the first voltage source (VDD for example).

The keeper circuit 414 further includes a fourth transistor 408 coupled in parallel with transistor 404, and a fifth transistor 406 coupled in parallel with transistor 402. The fourth transistor 408 includes a first current electrode coupled to the first current electrode of the second transistor 404, a second current electrode coupled to the second current electrode of the second transistor 404, and a control electrode coupled to an input labeled D. The fifth transistor 406 includes a first current electrode coupled to the first current electrode of the third transistor 402, a second current electrode coupled to the first voltage source, and a control electrode coupled to an input labeled C. Transistors 406 and 408 of keeper circuit 414 are configured each in parallel with respective transistors 402 and 404 such that the keeper strength can be adjusted by activating (turning on) or deactivating (turning off) transistors 406 and 408.

The term keeper strength as used herein, is generally referred to as a characteristic associated with how effectively the keeper circuit 414 can source current to offset bit line leakage current while sustaining an appropriate logic level voltage on the input of sense amplifier circuit 412. For example, when transistors of the keeper circuit are configured or adjusted to have an increased current carry capacity, the keeper strength is increased and thereby more capable of offsetting leakage current and sustaining the appropriate logic level.

In alternative embodiments, keeper circuit 414 may include any suitable arrangement of transistors such that the keeper strength can be adjusted based on control or configuration signals. For example, an alternative keeper circuit may include a first transistor having a first current electrode coupled to an input of a sense amplifier circuit and a control electrode coupled to an output of the sense amplifier circuit, and a second transistor may be coupled in series between a voltage source such as VDD and the first transistor. The second transistor may include a first current electrode coupled to a second current electrode of the first transistor, a second current electrode coupled to the voltage source, and a control electrode coupled to a first control signal. One or more keeper adjust transistor may be coupled in parallel with the second transistor. For example, a first keeper adjust transistor may include a first current electrode coupled to the first current electrode of the second transistor, a second current electrode coupled to the second current electrode of the second transistor, and a control electrode coupled to a first keeper adjust signal. Similarly, a second keeper adjust transistor may be coupled in parallel with the second transistor, and include a control electrode coupled to a second keeper adjust signal, and so on.

In the embodiment depicted in FIG. 3, dummy sense amplifier circuits DSA1-4 are coupled to respective dummy bit lines DBL1-4 at the inputs labeled IN and are coupled to provide respective dummy sense amplifier output signals DSAO1-4 at the outputs labeled OUT. The DSAO1-4 signals are used to form keeper adjust signals DSAO12 and DSAO34 provided to respective inputs C and D of sense amplifier circuits SA1-N. Dummy bit lines DBL1-4 may be configured in any manner having any number of dummy bit cells coupled to DBL1-4. In this embodiment, dummy bit lines DBL1 and DBL3 are configured to represent a worse case bit line leakage scenario, and dummy bit lines DBL2 and DBL4 are configured to represent a best case bit line leakage scenario. For example, a dummy bit line representing a worse case leakage scenario for a memory array having 256 word lines may have 256 dummy bit cells coupled to the dummy bit line. While one dummy bit cell is programmed as a logic "1" and turned on, remaining dummy bit cells of the dummy bit line are programmed as a logic "0" and turn off. In contrast, DBL2 and DBL4 are each configured to have only one of the dummy bit cells programmed as a logic "0" and turned on, while the remaining dummy bit cells coupled to DBL2 and DBL4 are programmed as a logic "1" and turned off.

Inputs labeled A-D of dummy sense amplifier circuits DSA1-4 are coupled to control electrodes of keeper transistors of keeper circuit 414 and are coupled to receive control or configuration signals. In this embodiment, inputs A and B of each dummy sense amplifier circuit DSA1-4 are coupled to a second voltage source such as VSS or ground such that corresponding keeper transistors 402 and 404 are turned on or conducting during normal operation of ROM 110. Inputs C and D of each dummy sense amplifier circuit DSA1-4 are each coupled to the first voltage source (VDD) or the second voltage source such (ground) such that corresponding keeper transistors (406 and 408) are configured to provide a predetermined keeper strength during normal operation of ROM 110. In this embodiment, inputs C and D of dummy sense amplifier circuits DSA1 and DSA4 are each coupled to the first voltage source (VDD) such that corresponding keeper transistors 406 and 408 are turned off or non-conducting during normal operation of ROM 110. Inputs C and D of dummy sense amplifier circuit DSA2 are configured such that corresponding keeper transistor 406 is turned off and transistor 408 is turned on, and inputs C and D of dummy sense amplifier circuit DSA3 are configured such that corresponding keeper transistor 406 is turned on and transistor 408 is turned off during normal operation of ROM 110. In some embodiments, inputs A-D of dummy sense amplifier circuits DSA1-4 may be coupled to one or more control or configuration signals which can provide a logic low voltage level such that a corresponding keeper transistor (402-408) can be turned on or conducting during normal operation of ROM 110, and turned off when the corresponding control or configuration signal provides a logic high voltage level.

Dummy sense amplifier output signals DSAO1-4 are combined with dummy logic circuitry formed with logic gates 314-322. NAND gate 314 includes a first input coupled to receive the DSAO1 signal, a second input coupled to receive the DSAO2 signal, and an output providing a first keeper adjust signal labeled DSAO12 to the C inputs of sense amplifier circuits SA1-N. NAND gate 316 includes a first input coupled to receive the DSAO3 signal, a second input coupled to receive the DSAO4 signal, and an output providing a second keeper adjust signal labeled DSAO34 to the D inputs of sense amplifier circuits SA1-N. An input of inverter 318 is coupled to receive dummy sense amplifier output signal DSAO2, a first input of NAND gate 320 is coupled to receive the DSAO4 signal, and a second input of NAND gate 320 is coupled to receive the inverse of the DSAO2 signal provided at the output of inverter 318. An output signal of NAND gate 320 is provided to an input of inverter 322 and an output signal labeled FLAG is provided at the output of inverter 322.

Still referring to FIG. 3, sense amplifier circuits SA1-N are coupled to respective memory array (208) bit lines BL1-N at the inputs labeled IN, where N is the number of sense amplifier circuits to sense data stored in memory array (208). Outputs labeled OUT of sense amplifier circuits SA1-N are coupled to drivers 324 and 326 to provide respective sense amplifier output signals SO1-N. Inputs labeled A-D of sense amplifier circuits SA1-N are coupled to control electrodes of keeper transistors of keeper circuit 414 and are coupled to receive control or configuration signals. In this embodiment, inputs A and B of each sense amplifier circuit SA1-N are coupled to a second voltage source such as VSS or ground such that corresponding keeper transistors 402 and 404 are turned on or conducting during normal operation of ROM 110. In some embodiments, inputs A and B of sense amplifier circuits SA1-N may be coupled to a control or configuration signal which can provide a logic low voltage level such that corresponding keeper transistor 402 and 404 can be turned on or conducting during normal operation of ROM 110, and turned off when the corresponding control or configuration signal provides a logic high voltage level. Inputs C and D of each sense amplifier circuit SA1-N are each coupled to receive first and second keeper adjust signals labeled DSAO12 and DSAO34 respectively such that corresponding keeper adjust transistors (406 and 408) are turned on and off to adjust the keeper strength of the keeper circuit 414 during normal operation of ROM 110.

In operation, dummy sense amplifier circuits DSA1-4 are configured with a predetermined keeper circuit arrangement and a predetermined number of memory cells coupled to dummy bit lines DBL1-4. As conditions change such as the size of ROM arrays, temperature, voltage, and the like, outputs of the dummy sense amplifier circuit can dynamically respond and provide corresponding outputs signals DSAO1-4. These DSAO1-4 signals are combined to generate keeper adjust signals which are provided to sense amplifier circuits SA1-N, thereby adaptably changing the characteristics of the sense amplifier circuits SA1-N. For example, if a dummy sense amplifier circuit detects that its keeper circuit cannot keep up with coupled dummy bit line leakage current, a corresponding output signal can be provided to the sense amplifier circuits such that the keeper strength is increased accordingly. Another aspect of operation includes DSAO2 and DSAO4 signals combined with circuitry to generate the FLAG output signal. For example, a dummy sense amplifier circuit may be configured to determine an out-of-operating-range indication whereby none of the keeper adjust transistors cannot put the sense amplifier circuits into correct functionality operating range. The out-of-operating-range indication can be provided as a flag to the data processing system 100 notifying the system that ROM 110 is currently unusable or not within normal operating condition, and allowing the system to go into a safe or corrective state.

Generally, there is provided, a read-only memory (ROM) including a first bit line; a first dummy bit line; a first dummy sense amplifier coupled to the first dummy bit line, the first dummy sense amplifier providing a first output signal; a first sense amplifier coupled to the first bit line; and a first keeper circuit coupled to the first bit line and the first sense amplifier, the first keeper circuit configured to increase keeper strength based on the first output signal. The first dummy bit line may be configured having only one dummy memory cell coupled to the first dummy bit line. The ROM may further include a flag generation circuit to provide a flag signal indicative that the ROM is no longer in a normal operating condition, the flag signal based on the first output signal. The first keeper circuit may further include a first transistor having a first current electrode coupled to the first bit line and a control electrode coupled to an output of the first sense amplifier; a second transistor having a first current electrode coupled to a second current electrode of the first transistor, and a control electrode coupled to a first voltage source; and a third transistor having a first current electrode coupled to the second current electrode of the first transistor, a second current electrode coupled to a second current electrode of the second transistor, and a control electrode coupled to receive the first output signal. The first keeper circuit may further include a fourth transistor having a first current electrode coupled to a second current electrode of the second transistor, a second current electrode coupled to a second voltage source, and a control electrode coupled to the first voltage source; and a fifth transistor having a first current electrode coupled to the second current electrode of the third transistor, a second current electrode coupled to the second voltage source, and a control electrode coupled to receive a second output signal from a second dummy sense amplifier. The ROM may further include a first dummy keeper circuit coupled to the first dummy bit line and to the first dummy sense amplifier. The ROM may further include a second dummy bit line; a second dummy sense amplifier coupled to the second dummy bit line, the second dummy sense amplifier providing a second output signal; and a second dummy keeper circuit coupled to the second dummy bit line and to the second dummy sense amplifier; wherein the first keeper circuit is configured to increase keeper strength based on the first output signal and the second output signal. The second dummy bit line may be configured having a plurality of memory cells coupled to the second dummy bit line. The first dummy sense amplifier and keeper circuit, the second dummy sense amplifier and keeper circuit, and the first sense amplifier and keeper circuit may be substantially similar to each other.

In another embodiment, there is provided, a read-only memory (ROM) including a first bit line; a first dummy bit line; a first dummy sense amplifier having an input coupled to the first dummy bit line and an output; a first sense amplifier having an input coupled to the first bit line and an output; a first keeper transistor having a first current electrode coupled to the first bit line and a control electrode coupled to the first sense amplifier output; and a second keeper transistor having a first current electrode coupled to a second current electrode of the first keeper transistor, and a control electrode coupled to the output of the first dummy sense amplifier. The first keeper circuit may further include a third keeper transistor having a first current electrode coupled to the first current electrode of the second keeper transistor, a second current electrode coupled to a second current electrode of the second keeper transistor, and a control electrode coupled to a first configuration signal. The first keeper circuit may further include a fourth keeper transistor having a first current electrode coupled to a second current electrode of the second keeper transistor, a second current electrode coupled to a first voltage source, and a control electrode coupled to the first configuration signal; and a fifth keeper transistor having a first current electrode coupled to the second current electrode of the third keeper transistor, a second current electrode coupled to the first voltage source, and a control electrode coupled to receive a second output signal from a second dummy sense amplifier. The first configuration signal may provide a logic low level during normal operation of the ROM. The ROM may further include a first dummy keeper circuit coupled to the first dummy bit line and to the first dummy sense amplifier, and a second dummy keeper circuit coupled to a second dummy bit line and to the second dummy sense amplifier. The first dummy bit line may be configured having only one dummy memory cell coupled to the first dummy bit line. The ROM may further include a flag generation circuit to provide a flag signal indicative that the ROM is no longer in a normal operating condition, an input of the flag generation circuit coupled to the output of the first dummy sense amplifier.

In yet another embodiment, there is provided, a method for operating a read-only memory (ROM) including sensing a dummy bit line with a dummy sense amplifier circuit coupled to the dummy bit line to generate an dummy sensed output signal; and based on the dummy sensed output signal, adjusting a keeper strength of a keeper circuit coupled to a sense amplifier circuit, the sense amplifier circuit capable of sensing data stored in the ROM. The method may further include based on the dummy sensed output signal, generating a flag signal indicative that the ROM is no longer in a normal operating condition. The method may further include a dummy keeper circuit coupled to the dummy sense amplifier, and wherein circuitry forming the dummy sense amplifier and keeper circuit may be substantially the same as circuitry forming the sense amplifier circuit and keeper circuit. The adjusting a keeper strength of a keeper circuit may include increasing the keeper strength of the keeper circuit.

Therefore, by now it can be appreciated that there has been provided, an apparatus and method for sensing and operating a read-only memory (ROM). Because ROM array sizes and operating conditions may vary widely over a broad range of applications, an adaptable keeper circuit scheme is coupled with a single-ended sense amplifier to deliver optimum performance. Dummy sensing schemes are provided which allow for generation of control signals to adjust sense amplifier keeper circuits. The dummy sensing schemes can correspond to best case and worse case bit line leakage scenarios, for example. By utilizing the control signals generated from the dummy sensing schemes, keeper transistors can be activated to increase keeper strength in sense amplifiers circuits to sense data stored in the ROM.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary data processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of data processing system 100 are circuitry located on a single integrated circuit or within a same device. Alternatively, data processing system 100 may include any number of separate integrated circuits or separate devices interconnected with each other.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A read-only memory (ROM) comprising:
   a first bit line;
   a first dummy bit line;
   a first dummy sense amplifier coupled to the first dummy bit line, the first dummy sense amplifier providing a first output signal;
   a first sense amplifier coupled to the first bit line; and
   a first keeper circuit coupled to the first bit line and the first sense amplifier, the first keeper circuit configured to increase keeper strength based on the first output signal, the first keeper circuit comprising:
      a first transistor having a first current electrode coupled to the first bit line and a control electrode coupled to an output of the first sense amplifier,
      a second transistor having a first current electrode coupled to a second current electrode of the first transistor, and a control electrode coupled to a first voltage source, and
      a third transistor having a first current electrode coupled to the second current electrode of the first transistor, a second current electrode coupled to a second current electrode of the second transistor, and a control electrode coupled to receive the first output signal.

2. The ROM of claim 1, wherein the first dummy bit line is configured having only one dummy memory cell coupled to the first dummy bit line.

3. The ROM of claim 2, further comprising a flag generation circuit to provide a flag signal indicative that the ROM is no longer in a normal operating condition, the flag signal based on the first output signal.

4. The ROM of claim 1, wherein the first keeper circuit further comprises:
   a fourth transistor having a first current electrode coupled to a second current electrode of the second transistor, a second current electrode coupled to a second voltage source, and a control electrode coupled to the first voltage source; and a fifth transistor having a first current electrode coupled to the second current electrode of the third transistor, a second current electrode coupled to the second voltage source, and a control electrode coupled to receive a second output signal from a second dummy sense amplifier.

5. The ROM of claim 1, further comprising a first dummy keeper circuit coupled to the first dummy bit line and to the first dummy sense amplifier.

6. The ROM of claim 5, further comprising:
a second dummy bit line;
a second dummy sense amplifier coupled to the second dummy bit line, the second dummy sense amplifier providing a second output signal; and
a second dummy keeper circuit coupled to the second dummy bit line and to the second dummy sense amplifier;
wherein the first keeper circuit is configured to increase keeper strength based on the first output signal and the second output signal.

7. The ROM of claim 6, wherein the second dummy bit line is configured having a plurality of memory cells coupled to the second dummy bit line.

8. The ROM of claim 6, wherein the first dummy sense amplifier and keeper circuit, the second dummy sense amplifier and keeper circuit, and the first sense amplifier and keeper circuit are substantially similar to each other.

9. A read-only memory (ROM) comprising:
a first bit line;
a first dummy bit line;
a first dummy sense amplifier having an input coupled to the first dummy bit line and an output;
a first sense amplifier having an input coupled to the first bit line and an output;
a first keeper transistor having a first current electrode coupled to the first bit line and a control electrode coupled to the first sense amplifier output; and
a second keeper transistor having a first current electrode coupled to a second current electrode of the first keeper transistor, and a control electrode coupled to the output of the first dummy sense amplifier.

10. The ROM of claim 9, wherein the first keeper circuit further comprises:
a third keeper transistor having a first current electrode coupled to the first current electrode of the second keeper transistor, a second current electrode coupled to a second current electrode of the second keeper transistor, and a control electrode coupled to a first configuration signal.

11. The ROM of claim 10, wherein the first keeper circuit further comprises:
a fourth keeper transistor having a first current electrode coupled to a second current electrode of the second keeper transistor, a second current electrode coupled to a first voltage source, and a control electrode coupled to the first configuration signal; and
a fifth keeper transistor having a first current electrode coupled to the second current electrode of the third keeper transistor, a second current electrode coupled to the first voltage source, and a control electrode coupled to receive a second output signal from a second dummy sense amplifier.

12. The ROM of claim 11, wherein the first configuration signal provides a logic low level during normal operation of the ROM.

13. The ROM of claim 11, further comprising a first dummy keeper circuit coupled to the first dummy bit line and to the first dummy sense amplifier, and a second dummy keeper circuit coupled to a second dummy bit line and to the second dummy sense amplifier.

14. The ROM of claim 9, wherein the first dummy bit line is configured having only one dummy memory cell coupled to the first dummy bit line.

15. The ROM of claim 14, further comprising a flag generation circuit to provide a flag signal indicative that the ROM is no longer in a normal operating condition, an input of the flag generation circuit coupled to the output of the first dummy sense amplifier.

16. A method for operating a read-only memory (ROM), the method comprising:
sensing a dummy bit line with a dummy sense amplifier circuit coupled to the dummy bit line to generate a dummy sensed output signal;
forming a keeper circuit with a first keeper transistor having a first current electrode coupled to a first bit line and a control electrode coupled to an output of a sense amplifier circuit and a second keeper transistor having a first current electrode coupled to a second current electrode of the first keeper transistor; and
applying the dummy sensed output signal to a control electrode of the second keeper transistor to adjust a keeper strength of the keeper circuit coupled to the sense amplifier circuit, the sense amplifier circuit capable of sensing data stored in the ROM.

17. The method of claim 16, further comprising based on the dummy sensed output signal, generating a flag signal indicative that the ROM is no longer in a normal operating condition.

18. The method of claim 16, further comprising a dummy keeper circuit coupled to the dummy sense amplifier, and wherein circuitry forming the dummy sense amplifier and keeper circuit is substantially the same as circuitry forming the sense amplifier circuit and keeper circuit.

19. The method of claim 16, wherein adjusting a keeper strength of a keeper circuit includes increasing the keeper strength of the keeper circuit.

\* \* \* \* \*